(12) United States Patent
Kerdiles et al.

(10) Patent No.: US 8,349,703 B2
(45) Date of Patent: Jan. 8, 2013

(54) METHOD OF BONDING TWO SUBSTRATES

(75) Inventors: Sébastien Kerdiles, Saint-Ismier (FR);
Willy Michel, Lunel (FR); Walter Schwarzenbach, Saint Nazaire les Eymes (FR); Daniel Delprat, Crolles (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 153 days.

(21) Appl. No.: 12/525,493

(22) PCT Filed: Nov. 23, 2007

(86) PCT No.: PCT/EP2007/062750
§ 371 (c)(1),
(2), (4) Date: Jul. 31, 2009

(87) PCT Pub. No.: WO2008/107029
PCT Pub. Date: Sep. 12, 2008

(65) Prior Publication Data
US 2010/0093152 A1    Apr. 15, 2010

Related U.S. Application Data

(63) Continuation-in-part of application No. 11/873,311, filed on Oct. 16, 2007, now Pat. No. 7,645,682.

(30) Foreign Application Priority Data

Feb. 16, 2007   (FR) ...................................... 07 53318

(51) Int. Cl.
*H01L 21/30*   (2006.01)
*H01L 21/46*   (2006.01)

(52) U.S. Cl. ................................ 438/458; 257/E21.567
(58) Field of Classification Search .......... 438/455–459; 257/E21.119, E21.122, E21.211, E21.561, 257/E21.567, E21.568
See application file for complete search history.

(56) References Cited

U.S. PATENT DOCUMENTS

| 5,223,168 A | 6/1993 | Holt ............................... 510/238 |
| 6,018,211 A | 1/2000 | Kanaboshi et al. ....... 310/313 R |
| 6,312,797 B1 * | 11/2001 | Yokokawa et al. ........... 428/336 |

(Continued)

FOREIGN PATENT DOCUMENTS

EP    0 969 500    1/2000

(Continued)

OTHER PUBLICATIONS

International Search Report, PCT/EP2007/062750, dated May 28, 2008.

*Primary Examiner* — Charles Garber
*Assistant Examiner* — Calvin Choi
(74) *Attorney, Agent, or Firm* — Winston & Strawn LLP

(57) ABSTRACT

The invention relates to a method of forming a structure comprising a thin layer of semiconductor material transferred from a donor substrate onto a second substrate, wherein two different atomic species are co-implanted under certain conditions into the donor substrate so as to create a weakened zone delimiting the thin layer to be transferred. The two different atomic species are implanted so that their peaks have an offset of less than 200 Å in the donor substrate, and the substrates are bonded together after roughening at least one of the bonding surfaces.

15 Claims, 4 Drawing Sheets

U.S. PATENT DOCUMENTS

| | | | |
|---|---|---|---|
| 6,342,433 B1 | 1/2002 | Ohmi et al. | 438/455 |
| 6,388,290 B1 | 5/2002 | Celler et al. | 257/350 |
| 6,562,127 B1* | 5/2003 | Kud et al. | 117/94 |
| 7,446,019 B2 | 11/2008 | Daval et al. | 438/459 |
| 2004/0035525 A1 | 2/2004 | Yokokawa et al. | 156/281 |
| 2004/0152282 A1* | 8/2004 | Tong et al. | 438/455 |
| 2004/0262686 A1 | 12/2004 | Shaheen et al. | 257/347 |
| 2005/0029224 A1* | 2/2005 | Aspar et al. | 216/33 |
| 2005/0148163 A1* | 7/2005 | Nguyen et al. | 438/514 |
| 2005/0170102 A1* | 8/2005 | Matsumoto et al. | 427/535 |
| 2005/0218111 A1 | 10/2005 | Maleville et al. | 216/33 |
| 2006/0060943 A1 | 3/2006 | Ben Mohamed et al. | 257/607 |
| 2006/0240642 A1 | 10/2006 | Kerdiles | 438/455 |
| 2006/0273068 A1* | 12/2006 | Maunand Tussot et al. | 216/33 |
| 2007/0090479 A1 | 4/2007 | Chen et al. | 257/433 |
| 2007/0119812 A1 | 5/2007 | Kerdiles et al. | 216/34 |
| 2007/0141802 A1* | 6/2007 | Gadkaree | 438/455 |
| 2007/0232022 A1* | 10/2007 | Henley et al. | 438/455 |

FOREIGN PATENT DOCUMENTS

| | | |
|---|---|---|
| FR | 2 868 599 | 10/2005 |
| FR | 2 884 966 | 10/2006 |
| JP | 05-166689 A | 7/1993 |
| JP | 2003-309101 A | 10/2003 |

* cited by examiner

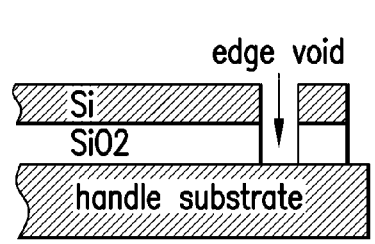
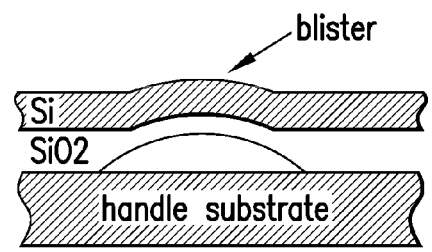
FIG. 1  FIG. 2
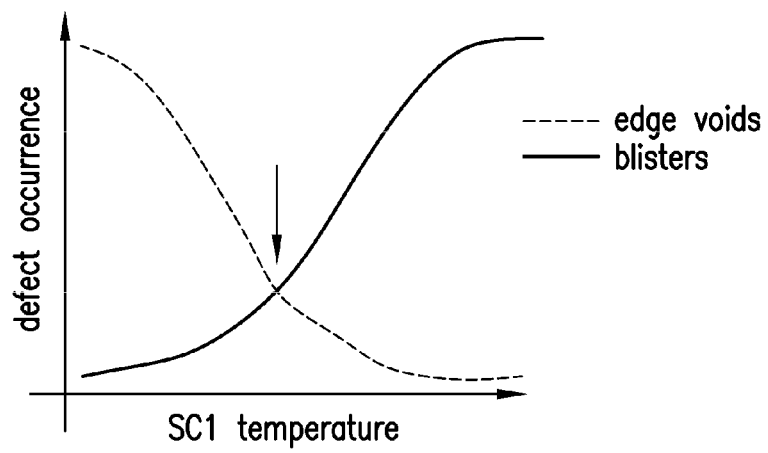
FIG. 3
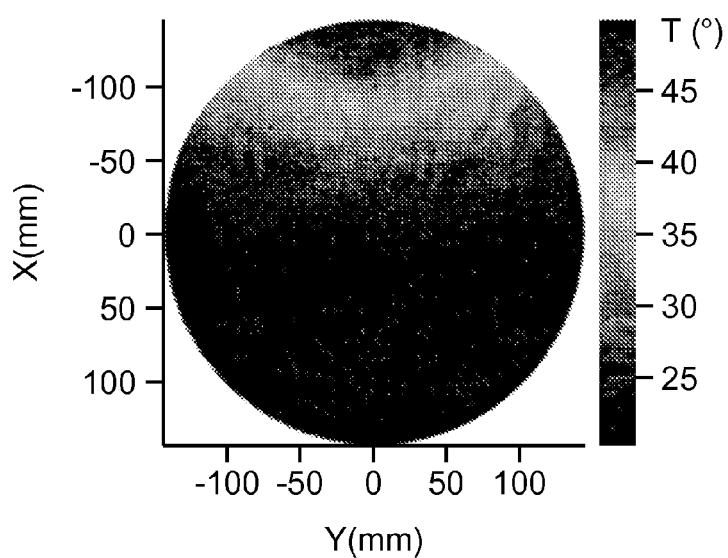
FIG. 5

METHOD OF BONDING TWO SUBSTRATES

This application is a 371 filing of International Patent Application PCT/EP2007/062750 filed Nov. 23, 2007, and is a continuation-in-part of application Ser. No. 11/873,311 filed Oct. 16, 2007, now U.S. Pat. No. 7,645,682.

CONTEXT

The present invention relates to the production of composite structures for electronics, optics or microelectronics.

More precisely, the invention relates to a method of bonding two substrates together.

The invention also relates to a method of forming a structure comprising a layer of semiconductor material taken from a donor substrate, said donor substrate itself having been formed by bonding two substrates.

In order to bond two substrates together, a first substrate is typically brought into contact with a second substrate so as to create bonding by molecular adhesion of the substrates to each other.

One application of such bonding is that which is carried out in the scope of producing structures of the "semiconductor on insulator" type (SeOI), and in particular structures of the "silicon on insulator" type (SOI).

In this application context, at least one of the substrates to be bonded has a surface oxide layer; for example, Si/$SiO_2$ bonding or $SiO_2$/$SiO_2$ bonding is typically carried out in order to form an SOI structure.

Bonding by molecular adhesion is a technique for making two substrates having perfectly plane surfaces ("mirror polished") adhere to one another, without applying an adhesive (such as a bonder, glue, etc.).

The surfaces in question are generally those of substrates made of electrically insulating material (for example quartz, glass) or of semiconductor material (for example Si, GaAs, SiC, Ge).

The bonding is typically initiated by local application of a slight pressure onto one or both substrates brought into contact.

A bonding wave then propagates over the entire extent of the substrates in a few seconds, so as to join the two substrates together on the atomic scale.

The bonding energy obtained at room temperature is generally quite low compared to that observed between two solids connected covalently, ionically or metallically.

In order to obtain satisfactory bonding of two substrates to each other, one and/or the other of the surfaces to be bonded is typically prepared before bonding. The purpose of this is to increase the mechanical strength and/or improve the quality of the bonding interface.

Such preparation typically involves a chemical treatment—referred to as cleaning—of the surfaces of the substrates to be bonded.

The cleaning is intended in particular to impart one or more of the following properties to the surfaces to be bonded:
- absence of particles;
- absence of hydrocarbons;
- absence of metal contaminants;
- low surface roughness, typically less than 5 Å rms;
- strong hydrophobicity, that is to say a high density of silanol bonds (Si—OH bonds) terminating the surfaces to be bonded.

The following may be mentioned as examples of cleaning before bonding:
- cleaning of the RCA type, namely the combination of an SC1 bath ("standard clean 1") comprising ammonium hydroxide ($NH_4OH$), hydrogen peroxide ($H_2O_2$) and water ($H_2O$), designed to remove particles and hydrocarbons, and an SC2 bath ("standard clean 2") comprising hydrochloric acid (HCl), hydrogen peroxide ($H_2O_2$) and water ($H_2O$), designed to remove metal contaminants;
- cleaning with an ozonized solution ($O_3$), designed to remove organic contaminants;
- cleaning with a solution containing a mixture of sulfuric acid and oxygenated water ("sulfuric peroxide mixture" (SPM)).

Controlling the various cleaning parameters (in particular the temperature of the baths) makes it possible to prevent the appearance of certain defects on the bonding interface of the bonded structure.

These induced defects are, for example, blisters on the bonding interface between the two substrates.

Another type of defect may moreover be observed in the event that a thin layer of donor substrate is being transferred to a handle substrate, methods of the Smart Cut™ type being an advantageous example of such transfer (regarding methods of the Smart Cut™ type, the person skilled in the art may for example refer to "*Silicon Wafer bonding technology for VLSI and MEMS applications*", S. S. Iyer and A. J. Auberton-Hervé, IEE, 2002). In such a case holes, located in the peripheral region of the handle substrate, may actually be observed in the transferred thin layer. These untransferred zones with a diameter of between 50 μm and 2 mm, located between 0.5 and 5 mm from the edge of the structure, are referred to as "edge voids".

FIG. 1 schematically shows a view in section of an SOI with an edge void. The layers transferred onto the handle substrate have a hole with a diameter typically lying between 50 μm and 2 mm, situated 1-5 mm from the edge of the structure.

The edge voids are thus macroscopic defects associated with poor bonding of the substrates at the edge. They are serious and generally critical defects. This is because in the absence of a thin layer serving as an active layer for the formation of electronic components at the position of an edge void, no component can be fabricated at this position. In view of the size of the edge voids, an electronic component comprising at least one edge void will necessarily be defective.

Defects of the "blister" type correspond to local disbonding between the transferred thin layer and the handle substrate. For example, in the case of an SOI obtained by the Smart Cut™ method, the bonding of an Si handle substrate to an oxidized and implanted donor substrate may lead to the observation of blisters on the structure obtained after transfer. These blisters result from local disbonding between the handle substrate and the oxide of the transferred thin layer, as schematized in FIG. 2.

This local disbonding is encouraged by any particles, hydrocarbon traces or surface irregularities (locally higher micro-roughness) on the surface of one and/or both substrates brought into contact.

In the event that the bonding is carried out with a view to transfer of the Smart Cut™ type (for the sake of simplicity, this case will be referred to as "SOI formation" in the rest of this text), the blisters created on the bonding interface between the donor substrate and the handle substrate may expand during the separating anneal involved in such transfer, which may damage the working layer of the final structure obtained after the transfer.

As schematized in FIG. 2, in the scope of SOI formation the blisters may be located at the center and at the periphery of the structure.

The blisters are thus circular macroscopic defects with a diameter typically lying between 0.1 mm and 3 mm, after thin layer transfer.

In such a case, blisters are critical defects for an SOI.

It is known that defects of the blister and edge void type are associated with the bonding and surface preparation.

More precisely, it has been observed that certain conditions of cleaning before bonding lead to a bonding in which:
the appearance of blister type defects on the bonding interface is prevented by using in particular an SC1 bath with a low concentration, and above all at a low temperature (typically of the order of at most 65° C.),
the appearance of edge void type defects on the bonding interface after transfer is prevented by using in particular an SC1 bath at a high temperature (typically of the order of at least 70° C.).

The conditions mentioned above, for avoiding defects of the blister and edge void type, are thus mutually conflicting.

In practice, the step of preparation by cleaning therefore entails finding a compromise (particularly as regards the temperature at which the cleaning is carried out before bonding) in order to obtain a bonding interface on which more or fewer blisters and edge voids will be observed.

SUMMARY OF THE INVENTION

The present invention proposes to overcome the problems mentioned above, and in particular to obviate the need for a compromise in defining the cleaning conditions (particularly temperature), in order to prevent the appearance of edge void type defects and the appearance of blister type defects on the bonding interface between two substrates.

To this end, a first aspect of the invention provides a method of bonding two substrates together during which the surfaces of said substrates are brought into contact with each other, comprising at least one step of cleaning the surface of one and/or the other of the substrates to be bonded before their surfaces are brought into contact, characterized in that
the cleaning step is carried out so that each surface cleaned is not significantly roughened, and in that
the bonding is furthermore preceded by heating at least one substrate to be bonded, said heating being initiated before the surfaces of the substrates are brought into contact and continued at least until they have been brought into contact.

Preferred but nonlimiting aspects of this method are as follows:
the heating ends at the latest at the end of propagation of the bonding wave between the two substrates;
the cleaning of the surfaces of one and/or the other of the substrates to be bonded involves etching which leads to an increase of between 0 and 20% in the roughness of the etched surface;
the step of cleaning one and/or the other of the substrates to be bonded involves etching a thickness of less than 15 angstroms;
the cleaning step is carried out by means of a bath at a temperature of less than 65° C.;
the cleaning step is carried out by means of a bath based on $NH_4OH$, $H_2O_2$, $H_2O$, or a bath based on $NH_4OH$, $H_2O_2$, $H_2O$ followed by a bath based on $HCl$, $H_2O_2$, $H_2O$, or by using an ozonized bath followed by a bath based on $NH_4OH$, $H_2O_2$, $H_2O$ followed by a bath based on $HCl$, $H_2O_2$, $H_2O$, by using a bath of sulfuric acid and oxygenated water followed by a bath based on $NH_4OH$, $H_2O_2$, $H_2O$, followed by a bath based on $HCl$, $H_2O_2$, $H_2O$;
the cleaning step is carried out by using dry ozone followed by a bath based on $NH_4OH$, $H_2O_2$, $H_2O$, followed by a bath based on $HCl$, $H_2O_2$, $H_2O$;
the method may comprise a plasma activation step, carried out after the cleaning step and before the step of bonding one and/or the other of the substrates to be bonded;
the plasma is based on $O_2$ and/or $N_2$;
the plasma leads to a decrease in the roughness of one and/or the other of said substrates to be bonded;
the temperature of the bath based on $NH_4OH$, $H_2O_2$, $H_2O$ is less than 65° C.;
the bath based on $NH_4OH$, $H_2O_2$, $H_2O$:
has a mass percentage dose of $NH_4OH/H_2O_2$ typically between 1/2 and 6/6 and preferably between 1/2 and 3/4,
is at a temperature of between 5° C. and 60° C., preferably between 40° C. and 55° C.,
is applied for a few minutes, preferably three minutes;
the bath based on $HCl$, $H_2O_2$, $H_2O$:
has a mass percentage dose of HCl between 0.3% and 2%,
has a mass percentage dose of $H_2O_2$ between 0.3% and 2%,
is at a temperature of 30° C.,
is applied for a few minutes, preferably three minutes;
before the bonding step the heating is applied locally in a peripheral zone of at least one of the two substrates to be bonded, or applied uniformly over the extent of at least one of the two substrates to be bonded, and is carried out at a temperature of between 35° C. and 90° C., typically between 45° C. and 70° C.; furthermore, the heating is obtained by thermal conduction or by radiation.

The invention also relates to a method of forming a structure comprising a thin layer of semiconductor material transferred from a donor substrate onto a second substrate, the method comprising the following steps:
co-implanting two atomic species into the donor substrate so as to create a weakened zone delimiting the thin layer to be transferred, each of the species having a maximum concentration at a so-called "peak" depth,
cleaning the surface of one and/or the other of said substrates before the surfaces of the substrates to be bonded are brought into intimate contact,
bringing the second substrate into contact with the donor substrate so as to bond said substrates together,
transferring a part of the donor substrate to the second substrate so as to form said thin layer on the second substrate,
said method being characterized in that the two atomic species are implanted so that their peaks have an offset of less than 200 Å in the thickness of the donor substrate, and in that the bonding is carried out according to the bonding method described above.

The peaks of the two atomic species, which are advantageously hydrogen and helium, are preferably are aligned at the same depth of the donor substrate.

According to a particular embodiment, the implantation energy of hydrogen in a silicon donor substrate covered with a 1450 Å oxide layer is selected at 32 keV so that the hydrogen implantation peak lies at a depth of 2450 Å in the donor substrate, and the implantation energy of helium lies between 47 and 50 keV, preferably 49 keV.

DESCRIPTION OF THE FIGURES

Other characteristics and advantages of the invention may furthermore be found in the following description, which is purely illustrative and nonlimiting and should be read with reference to the appended drawings in which, besides FIGS. 1 and 2 which have already been discussed:

FIG. 3 illustrates the occurrence of blisters (solid lines) and edge voids (dashed lines) as a function of the temperature of the SC1 bath;

FIG. 5 illustrates a map of the temperature on a silicon substrate with a diameter equal to 300 mm after fifteen seconds of local heating in the upper part of the substrate, in the event that the edge voids are expected in this part owing to bonding initiated in the lower part of this substrate;

DESCRIPTION OF THE INVENTION

Figure 4A:
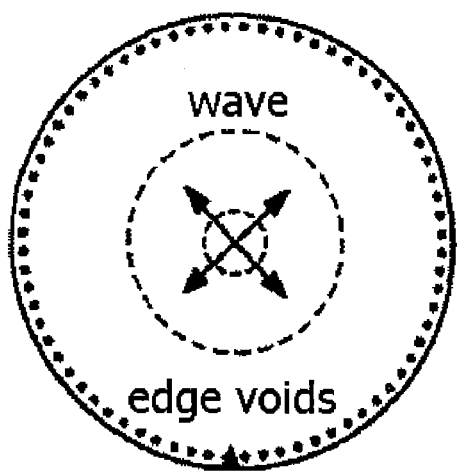
FIGS. 4a and 4b illustrate the propagation of the bonding wave according to whether the bonding is initiated from the center of the structure (FIG. 4a) or from the edge of the structure (FIG. 4b), the peripheral region in which the possible edge voids are expected being represented by dots.

As already mentioned, the invention relates to a method of bonding two substrates together.

The invention is intended in particular to obviate the compromise associated with the appearance of blisters and edge voids, as mentioned above.

The Applicant is aware that the occurrence of blister type defects can be reduced by modifying the parameters of the baths used for cleaning the surfaces to be bonded.

However, as already mentioned, the cleaning conditions which favor of the reduction of blisters tend to increase the occurrence of edge voids in the case of transfer.

The currently known practice therefore generally involves making a compromise in defining the cleaning conditions (in particular) as a function of the temperature and the acceptable number of blisters and edge voids.

FIG. 3 schematically illustrates the principle of such a compromise, and the occurrence of blisters (solid lines) and edge voids (dashed lines) being represented as a function of the temperature of the SC1 bath.

Thus:
 cleaning by means of an SC1 bath at a high temperature, leading to etching or roughening of the surface of the substrates being cleaned, makes it possible to avoid edge voids but encourages the appearance of blisters,
 cleaning by means of an SC1 bath at a low temperature, typically less than 65° C., leading to little roughening and very slight etching (removal less than 15 angstroms, typically 5-10 Å) of the surfaces of the substrates being cleaned, makes it possible to avoid blisters but encourages the appearance of edge voids.

It should be noted that the specifications governing the absence of edge voids are becoming more and more stringent.

The applicant proposes to select conditions aiming to prevent the appearance of blisters during the cleaning of the surfaces of the substrates, while overcoming concerns associated with the possible appearance of edge voids during this cleaning.

Such cleaning conditions should thus produce cleaned surfaces which have a roughness and a thickness which are "essentially" unchanged by the cleaning owing to the low level of etching.

It will be recalled that a low level of degradation of one and/or the other of the substrates to be bonded is typically obtained by means of an SC1 bath at a low temperature, typically less than 65° C.

More generally, any type of cleaning may be employed so long as it allows the cleaning step to be carried out in such a way that, after the cleaning, each cleaned surface has a roughness unchanged by cleaning or in the worst case increased by 20% relative to its value before the cleaning step. To this end, the roughness is measured by an AFM (atomic force microscope) over surfaces of $10\times10\,\mu m^2$. The roughening may then be evaluated by comparing the roughness after and before the cleaning.

Furthermore, the roughening by cleaning is associated with etching which it causes. It is therefore suitable to employ any type of cleaning which leads to less than 15 angstroms being etched, typically 5-10 Å.

The effect of not degrading the surfaces of one and/or the other of the substrates to be bonded is to limit the appearance of blisters.

The appearance of edge voids is then prevented by controlling the bonding (controlling the propagation speed of the bonding wave) of the substrates by means of heating one and/or the other of the substrates to be bonded.

The Applicant has developed a method for reducing the occurrence of edge voids, based on controlling the propagation speed of the bonding wave by heating one and/or the other of the substrates to be bonded.

Specifically, it appears that the propagation velocity of the bonding wave is affected on the one hand by the hydrophilic nature and on the other hand by the low roughness of the surfaces of the substrates to be bonded.

It therefore seems that the appearance of the blisters and the appearance of the edge voids can be controlled independently.

The invention thus proposes on the one hand to clean one and/or the other of the substrates to be bonded so that, after the cleaning, the cleaned surfaces of the substrates to be bonded are not significantly roughened (a condition conducive to preventing the appearance of blisters).

It is to be pointed out that the term "not significantly roughened" expresses a limited increase in the roughness. More precisely, this typically corresponds to an increase of between 0 and 20% in the roughness of the cleaned surface.

In order to obtain a surface which is not significantly roughened, the cleaning may involve etching a thickness of less than 15 angstroms.

The cleaning carried out may also comprise a plurality of steps. In all cases envisaged, each cleaned surface will have been "not significantly roughened" after the cleaning.

Before the bonding, it is moreover proposed to carry out cleaning of at least one substrate to be bonded, starting before the surfaces of the substrates are brought into contact and continuing at least until they have actually been brought into contact.

It should be noted that the heating ends at the latest at the end of propagation of the bonding wave between the two substrates.

It is to be pointed out that that the heating is not necessarily applied to the entire surface of one and/or the other of the substrates, but may be limited to a specific region of them. The heating may thus advantageously be restricted to a limited surface of the substrate, and in particular to the peripheral region liable to acquire defects of the edge void type.

The cleaning of one and/or the other of the substrates to be bonded may be carried out by combining a plurality of baths.

The baths used during the cleaning step lead to an increase of between 0 and 20% in the roughness of the surfaces of one and/or the other of the substrates to be bonded, and to a thickness of less than 15 angstroms being etched.

Cleaning carried out at a temperature of less than 65° C. is cleaning which leads to such results.

Preferably, the cleaning employed comprises an SC1 bath (mixture based on $NH_4OH$, $H_2O_2$, $H_2O$).

The SC1 bath may in particular be used at a temperature of between 5° C. and 60° C. (typically 40° C.-55° C.) for a few minutes (typically three minutes), with fairly low concentrations.

The concentration of $NH_4OH/H_2O_2$ (expressed as mass percentage) in the SC1 bath is typically between 1/2 and 6/6. These mass percentage doses are preferably equal to 1/2 or 3/4.

Such cleaning, using an SC1 bath, typically leads to about 5-15 angstroms being etched from a thermal oxide weakened by the ion implantation necessary for forming such an SOI.

The SC1 bath may advantageously be preceded by an ozone bath, an SPM (mixture based on $H_2SO_4/H_2O_2$) or cleaning based on dry ozone ($UV/O_3$ atmosphere) particularly in order to remove the organic contamination.

The SC1 bath may also advantageously be followed by an SC2 bath used at a low temperature (typically 30° C.) and with a low concentration (expressed as mass percentage), typically 0.3-2% for HCl and 0.3-2% for $H_2O_2$ (the remainder being water) for a time equal to about three minutes.

Using such an SC2 makes it possible to remove a very large proportion of the metallic contamination without degrading the hydrophilicity of the substrates to be bonded, which is favorable to the propagation of the bonding wave when it has been initiated.

Furthermore, one and/or the other of the substrates to be bonded, having been cleaned in this way, may also be subjected to a plasma activation treatment, preferably with an $O_2$ and/or $N_2$ plasma.

It should be noted that the plasma activation step may also be regarded as a dry cleaning step with a smoothing effect, thus corresponding to an additional cleaning step. Its use leads to an improvement in the surface condition of one and/or the other of the substrates to be bonded.

With the plasma activation being regarded as a cleaning step, it may consequently be seen that "the cleaning" is a succession of steps. According to the invention, it is the cleaning steps as a whole which must satisfy the roughness constraints of the surfaces to be bonded.

It should be noted that this plasma activation treatment is preferably carried out between the cleaning and the bonding per se, although it may also be carried out before the SC1 bath for removing the organic contamination.

When heating one and/or the other of the substrates to be bonded, the temperature range allowing the edge voids to be eliminated extends from 35° C. to 90° C., typically 45° C.-70° C.

It should be noted that this temperature range is dictated by the fact that the temperature should not be raised too much at the risk of reducing the bonding energy.

Specifically, if the substrates are bonded at too high a temperature, the bonding will not be effective. In certain cases, bonding may even prove impossible.

This is because the bonding is carried out in practice without applying a bonder or other glue. It is the water adsorbed onto each of the surfaces brought into contact (a few monolayers of water) which serves as a bonder and makes the two surfaces in contact adhere by means of Van der Waals forces.

Thus, if the substrates are heated to too high a temperature, too much of the adsorbed water (or even all of it) will be evaporated, which makes bonding impossible: the bonding wave is then incapable of propagating correctly over the surface of one and/or the other of the substrates to be bonded.

For the heating, it is therefore suitable to use the lowest of the temperatures allowing the edge voids to be eliminated, so as not to reduce the bonding energy which would entail the appearance of other defects (for example blisters after transfer of the thin layer).

Advantageously, it is not expedient to heat the entire surface of one and/or the other of the two substrates to be bonded. It is possible to heat only one of them.

Furthermore, it is also possible to heat only the zone where the edge voids might appear.

For example, if the bonding of the two substrates (circular in shape) is initiated from the edge, it is feasible to heat only the edge diametrically opposite this point. The critical zone for the appearance of edge voids will thus be heated without affecting the rest of the bonding, thus encouraging the propagation of the bonding wave over the rest of the surface of the substrates to be bonded.

Figure 4B:
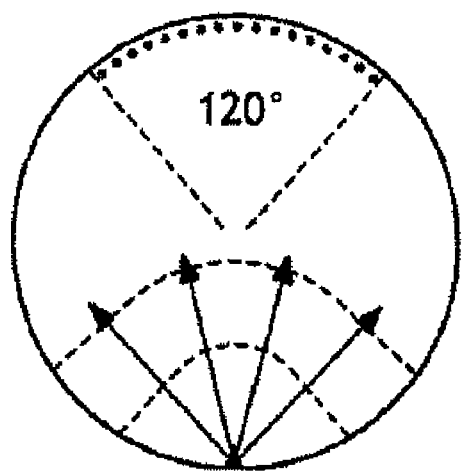

FIGS. 4a and 4b illustrate the propagation of the bonding wave according to whether the bonding of the two substrates is initiated from the center (cf. FIG. 5a) or from the edge (cf. FIG. 5b).

The local heating, or heating over all of one or both substrates, may be carried out for example by thermal conduction (for example by contact with a support which transmits its heat) or by radiation (for example a halogen lamp illuminating all or some of the substrate or substrates to be heated).

In particular, the zone where the edge voids might appear should remain at the desired temperature until the surfaces have been bonded in this zone.

The heating time depends strongly on the device used to raise then control the temperature of the heated zone.

For example, when using a halogen lamp delivering a power of 500 watts, the typical heating time lies between 15 seconds and 90 seconds (this range of times depends strongly on the distance between the substrates and the lamp).

After heating for a time of 15 seconds, for example, in the case of bonding initiated from the edge of the substrate, the opposite edge is preferably the hottest with a temperature of about 50° C.

For example, after heating for a time of 50 seconds under the same conditions, the maximum temperature measured on one and/or the other of the substrates reaches a value of close to 70° C.

FIG. 5 shows a map of the temperature on a silicon substrate with a diameter equal to 300 mm after 15 seconds of local heating, in the case in which the edge voids are expected in the upper part of the substrate owing to bonding initiated in the lower part of this substrate.

The method of the invention makes it possible to produce better-quality bonding in the context of forming an SOI.

In the case of the Smart Cut™ technology, this method thus makes it possible to avoid the edge voids and the blisters simultaneously (often critical macroscopic defects), leading to an increase in the yield and the quality of the structures obtained.

This substantial elimination of the blisters and the edge voids relates in particular to the conditions encouraging the appearance of blisters, that is to say when a high dose of hydrogen is implanted (H alone) or in the case of co-implanting helium and hydrogen, for example.

Specifically, according to the Smart Cut™ method, a weakened zone will have been formed before bonding by implanting atomic or ionic species into the thickness of the donor substrate, and separation of the donor substrate will be carried out in the weakened zone after bonding so as to transfer the thin layer onto a second substrate.

Conventionally, helium and hydrogen are co-implanted while offsetting the implantation peaks of these two species. This is because it has been shown that better results in terms of blisters are obtained by implanting the hydrogen so that its peak lies substantially at the depth of the separation plane, while the helium is implanted so that its peak lies a little deeper in the thickness of the donor substrate. Throughout this text, this peak will be defined as being the depth at which the concentration of the implanted species is a maximum.

Figure 6:
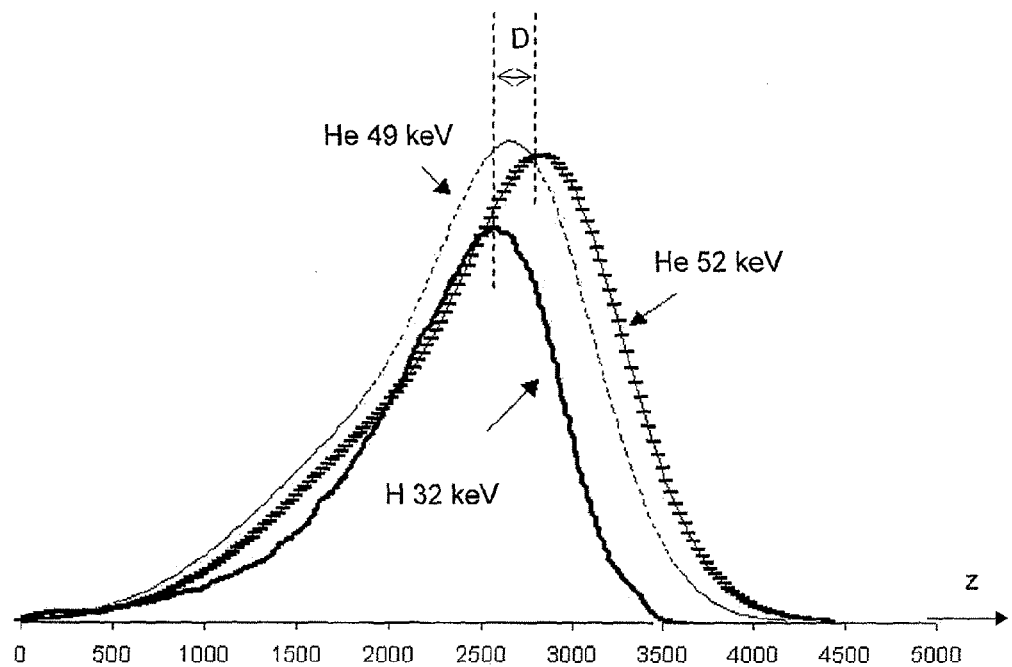
FIG. 6 illustrates helium peaks offset and aligned with the hydrogen peak.

The term offset is intended to mean a difference in depth within the donor substrate. Referring to FIG. 6, the z axis is perpendicular to the surface of the donor substrate in the direction of increasing depth, the origin being at the surface of the substrate on the implanted side. The offset between the peaks is represented by the double arrow D.

In fact, significant formation of blisters at the bonding interface is observed when the helium and hydrogen atoms are co-implanted with peaks aligned at the same depth. Conversely, when the helium implantation peak is offset in the depth of the donor substrate relative to the hydrogen implantation peak, it is observed that the formation of blisters is avoided. This problem is explained in US Patent Application 2006/0060943.

The term final roughness in this text is intended to mean the presence of a "dense zone" on the SOI wafer after separation in the weakened zone. The dense zone comprises shallow defects which do not open but are extended. It does not appear over the entire surface of the wafer, but is localized in the separation initiation region, as may be seen in FIGS. 8A to 8C in which the dense zone ZD is indicated by an arrow.

The dense zone induces a "low frequency" roughness revealed, in particular, by AFM (atomic force microscopy) over fields with a size of 30×30 μm², or 40×40 μm². This defect density may also be measured via a "haze" measurement carried out by means of an instrument of the Surfscan type. A typical value for the inspection threshold of a Surfscan SP2 apparatus for evaluating the dense zone is 90 nm.

The roughness of the dense zone on the one hand limits the inspection threshold of the wafer and, on the other hand, signifies a degradation of the surface quality. It is therefore desirable to limit the formation of this type of defect.

In this context, the applicant has carried out measurements on the dense zone after application of the method according to the invention to a structure in which the donor substrate has experienced helium and hydrogen co-implantation with the helium peak offset in the thickness of the donor substrate relative to the hydrogen peak. It was observed that cleaning by means of an SC1 bath at a low temperature has a favorable effect on the formation of blisters, but an unfavorable effect on the size of the dense zone.

Conversely, the Applicant has observed that the formation of blisters is reduced by aligning the hydrogen and helium implantation peaks at a substantially identical level in the thickness of the donor substrate and by cleaning at a low temperature according to the invention, and the dense zone is also thereby reduced. For its part, the formation of edge voids is limited by virtue of the heating during bonding. The term substantially identical depth is intended to mean an identical depth of the two peaks or a depth offset of less than 200 Å between the hydrogen and helium peaks.

Thus, combining the alignment of the hydrogen and helium peaks with the low temperature cleaning makes it possible not only to prevent the formation of blisters but also to reduce the defect density of the dense zone on the final SOI.

Particularly advantageously, the hydrogen implantation energy will be selected as a function of the desired implantation depth—and consequently the thickness of the thin layer to be transferred. It is within the capacity of the person skilled in the art to determine this energy, which also depends on the substrate to be implanted.

The helium implantation energy will then be defined so as to obtain a helium peak aligned with that of the hydrogen, or having an offset of less than 200 Å relative to the hydrogen peak.

It will be pointed out in passing, with reference to FIG. 6, that the hydrogen and helium peaks have different shapes: the hydrogen peak (H) is relatively narrow while that of helium (He) is broader.

Figure 7:
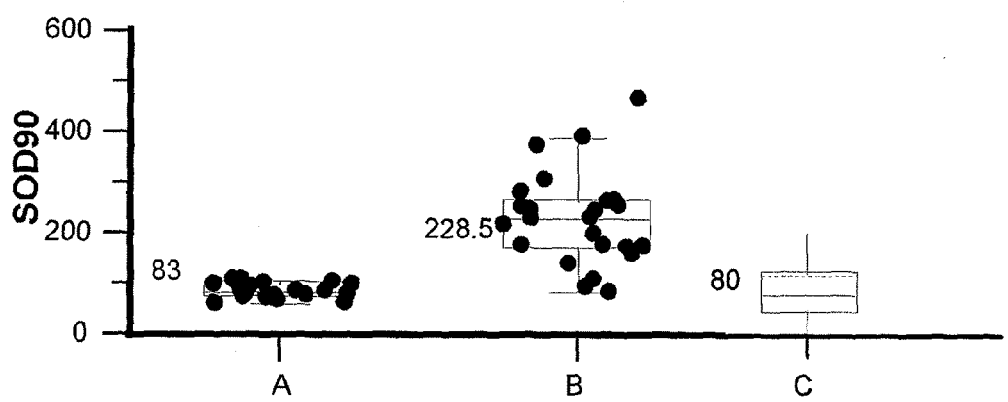
FIG. 7 represents the distribution of the "dense zone" type defects according to three compared method options.

For example, referring to FIG. 6, hydrogen and helium are co-implanted into a silicon donor substrate covered with a 1450 Å oxide layer, the hydrogen energy being selected at 32 keV so that the implantation peak lies at a depth of 2450 Å. In order to offset the peaks as in the prior art, a helium implantation energy of the order of 52 keV is selected, which leads to an offset of the order of 500 Å between the peaks. The defect density of the dense zone is typically more than 200 defects over a slice with a diameter of 300 mm, these defects being measured with the 90 nm threshold (case B in FIG. 7). In order to align the peaks, the helium implantation energy is reduced to a value of between 47 and 50 keV, preferably 49 keV. The defect density of the dense zone is then of the order of 80 over a slice with a diameter of 300 mm, still measured with the 90 nm threshold (case A in FIG. 7). For comparison, with the prior art method i.e. cleaning at 65° C. and an offset between the peaks identical to that of the case B, the defect density of the dense zone is of the order of 80 defects (case C in FIG. 7).

Figure 8A:
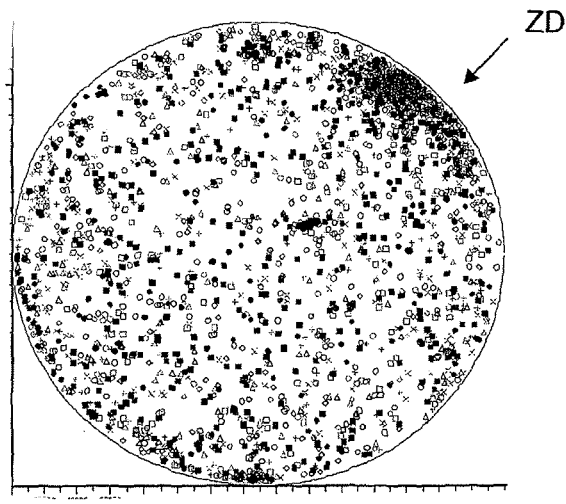
FIGS. 8A to 8C illustrate the presence of a dense zone by a superposition of the defect maps observed over typically 25 superimposed wafers under various conditions of implantation and cleaning.
Figure 8B:
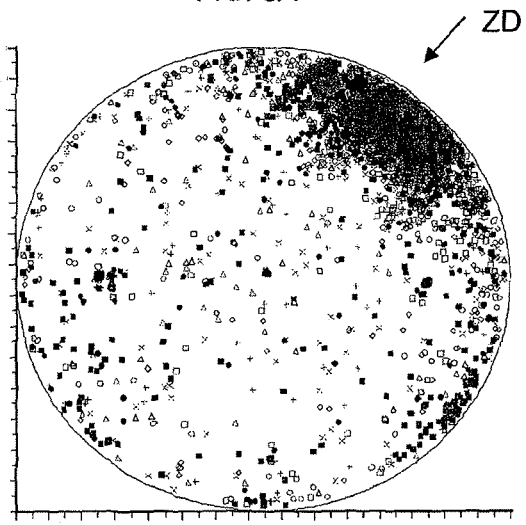
Figure 8C:
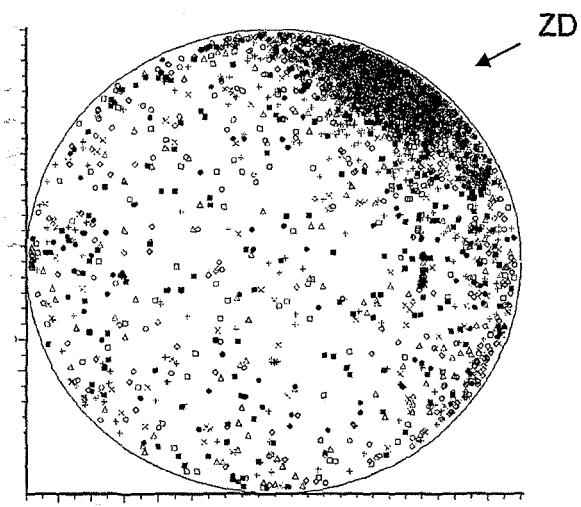

These results may be observed in FIGS. 8A to 8C.

FIG. 8A shows the presence of the dense zone ZD on an SOI wafer which has experienced co-implantation of hydrogen and helium with aligned peaks (the helium implantation energy being 49 keV), and cleaning before bonding in an SC1 bath at 55° C.

FIG. 8B illustrates the dense zone ZD on a wafer which has experienced co-implantation of hydrogen and helium with offset peaks (the helium implantation energy being 52 keV), and cleaning before bonding in an SC1 bath at 55° C. This dense zone is much more extended than in the previous case.

FIG. 8C illustrates the dense zone which has experienced co-implantation of hydrogen and helium with offset peaks (the helium implantation energy being 52 keV), and cleaning before bonding in an SC1 bath at 65° C.

These figures show that aligning the hydrogen and helium implantation peaks allows the defect density of the dense zone to be reduced substantially, here compensating for the degradation observed when reducing the temperature of the SC1 in the cleaning before bonding.

Returning now to the bonding method according to the invention, it turns out that it also makes it possible to avoid sorting the substrates upstream of the method. Specifically, sorting has conventionally been carried out based on the edge characteristics of the substrates to be bonded, as already mentioned, at this position where the edge voids are liable to appear. This sorting has led to high rejection of substrates.

The use of low temperatures for the RCA cleaning baths furthermore has an economic benefit, the lifetime of the baths been longer since under these conditions there is little evaporation of the chemical products constituting the baths. This presents the advantage of limiting the quantities of chemical products added in order to stabilize the concentrations of the solutions over time.

Above all, these cleaning conditions are very similar or identical to the other cleans involved in the Smart Cut™ method (cleaning after oxidation, after the heat treatments etc.).

Industrially, it is therefore sufficient to use one bath and potentially one apparatus for all the steps of the method.

It is therefore possible to envisage optimizing the cleaning and making the necessary adaptation to the bonding step by modifying the parameters of bonding time and temperature.

Furthermore, the method of the invention leads to substrates having low roughness before bonding, giving stronger bonding and a bonding interface which is easier to stabilize thereafter.

The method according to the invention also makes it possible to obviate the edge void/blister compromise obtained by varying the temperature of the SC1 bath when cleaning one and/or the other of the substrates to be bonded.

It may therefore be seen that the possibilities of regulating the parameters of the method are simplified because independent regulation can be carried out on the cleaning conditions to minimize the appearance of blisters, and the bonding conditions for eliminating the edge voids.

Results obtained by using the method of the invention are given below.

In the case of Si/implanted $SiO_2$ bonding to produce an SOI by Smart Cut™, the Si handle substrate is less sensitive to the cleaning (less easily etched and/or roughened). The typical roughness of such a handle substrate, measured by AFM over surfaces of $10 \times 10 \, \mu m^2$, is less than or equal to 1 angstrom rms. The donor substrate, consisting of silicon oxidized on the surface then implanted by co-implantation of helium and hydrogen, for example, is for its part much more easily roughened and etched by the cleaning because it has been weakened by the implantation. Its roughness, close to 1.2-1.4 angstroms rms before the cleaning, reaches about 2 angstroms rms after RCA cleaning with an SC1 at a temperature of 75° C., leading to 30 angstroms being etched. If the same donor substrate is subjected to the same cleaning at 40° C., conversely, its roughness remains unchanged in the range of 1.2-1.4 angstroms rms and the corresponding etching is close to 5 angstroms. The occurrence of blisters is then about four times less after cleaning at 40° C., compared with the same cleaning at 75° C.

Examples of producing a structure without blisters or edge voids are given below.

In a first example, the SOI is obtained according to the Smart Cut™ method with short-term local heating:
thermal oxidation and co-implantation of helium and hydrogen with concentrations of the order of $1 \times 10^{16}$ and $1 \times 10^{16}$ at/cm², respectively,
cleaning:
cleaning the two substrates by means of an ozone bath followed by rinsing,
cleaning by means of an SC1 bath at 40° C. for three minutes followed by rinsing (mass percentage dose of 3% for $NH_4OH$ and 4% for $H_2O_2$, the remainder being water),
cleaning by means of an SC2 bath at 30° C. for three minutes followed by rinsing (mass percentage dose of 0.7% for HCl and 0.5% for $H_2O_2$),
drying
bonding with short-term local heating:
brushing+rinsing the two substrates before bonding,
drying by centrifuging,
placing the substrates to be bonded facing one another on a bonding station,
bringing the substrates into contact then initiating the local heating by a halogen lamp with a power equal to 500 watts for 36 seconds,
initiating the bonding during the local heating, 20 seconds after the start of the latter, and
separating and finishing the SOI according to the Smart Cut™ method.

In this second example, the SOI is obtained according to the Smart Cut™ method with medium-term local heating:
thermal oxidation and hydrogen implantation with a high dose of the order of $7 \times 10^{16}$ at/cm²,
cleaning:
cleaning by means of an SC1 bath at 50° C. for three minutes followed by rinsing,
cleaning by means of an SC2 bath at 30° C. for three minutes followed by rinsing,
drying,
activating the donor substrate with a pure $O_2$ plasma,
bonding with medium-term local heating:
brushing followed by rinsing the substrates to be bonded before bonding,
drying by centrifuging,
placing the substrates to be bonded facing one another on a bonding station,
bringing the substrates into contact then initiating the local heating by a halogen lamp with a power equal to 500 watts for 50 seconds,
initiating the bonding during the local heating, 35 seconds after the start of the latter, and
separating and finishing the SOI according to the Smart Cut™ method.

The invention claimed is:

1. A method for reducing edge voids and blisters when forming a structure comprising a thin layer of semiconductor material transferred from a donor substrate onto a second substrate, which method comprises:
co-implanting two different atomic species into the donor substrate so as to create a weakened zone delimiting the thin layer to be transferred, each of the species having a maximum concentration at a so-called "peak" depth, with the two different atomic species implanted so that their peaks are aligned at substantially identical depths; and
molecularly bonding the donor and second substrates together by:
cleaning the surface of one or both of the substrates by means including a chemical bath under conditions selected so that the surface is etched by less than 10 Å to avoid blister formation during subsequent bonding wave propagation;
heating at least one or both of the substrates to a temperature in the range of 45° C. to 70° C. then contacting the substrates;
propagating a bonding wave between the substrates while retaining the substrate temperature in the range of 45° C. to 70° C. to reduce or eliminate edge voids during bonding wave propagation; and
transferring part of the donor substrate to the second substrate so as to form the thin layer on the second substrate.

2. The method of claim 1, wherein the peaks of the two atomic species have an offset of less than 200 Å in the donor substrate.

3. The method of claim 1, wherein the two different atomic species are hydrogen and helium.

4. The method of claim 3, wherein the donor substrate comprises a silicon substrate covered with a silicon oxide layer having a thickness of about 1450 Å, the hydrogen has an implantation energy of about 32 keV so that the hydrogen implantation peak lies at a depth of about 2450 Å in the donor substrate, and the helium has an implantation energy of between about 47 and 50 keV.

5. The method of claim 1, wherein the cleaning includes applying a bath that contains $NH_4OH$, $H_2O_2$ and $H_2O$ at a temperature of 40° C. and 55° C., the bath having a $NH_4OH/H_2O$ weight ratio of between about 1/2 and 3/4.

6. The method of claim 5, wherein the cleaning further includes applying a bath that includes HCl, $H_2O_2$ and $H_2O$.

7. The method of claim 6, wherein the cleaning includes sequentially applying a bath of ozone, followed by the $NH_4OH$, $H_2O_2$, and $H_2O$ bath, and then by the HCl, $H_2O_2$, and $H_2O$ bath.

8. The method of claim 6, wherein cleaning includes sequentially applying a bath of sulfuric acid and oxygenated water, followed by the $NH_4OH$, $H_2O_2$ and $H_2O$ bath, and then by the HCl, $H_2O_2$, and $H_2O$ bath.

9. The method of claim 6, wherein cleaning includes applying a dry ozone bath, followed by the $NH_4OH$, $H_2O_2$ and $H_2O$ bath, and then by the HCl, $H_2O_2$, and $H_2O$ bath.

10. The method of claim 6, wherein the $NH_4OH$, $H_2O_2$, and $H_2O$ bath has a temperature of about 40° C., and is applied for about three minutes, wherein the HCl, $H_2O_2$, and $H_2O$ bath has an HCl content of about 0.3% to 2% by weight, an $H_2O_2$ content of about 0.3% to 2% by weight, a temperature of about 30° C., and is applied for about three minutes.

11. The method of claim 1, which further comprises treating at least one substrate with a plasma activation treatment prior to placing the substrates in surface to surface contact.

12. The method of claim 10, wherein plasma activation includes applying an $O_2$-based plasma, $N_2$-based plasma, or $O_2$ and $N_2$-based plasma and is conducted in a manner to reduce surface roughness of one or both substrates.

13. The method of claim 1, wherein the heating includes thermal conduction or radiation and is applied locally at a peripheral zone of at least one of the substrates.

14. The method of claim 1, wherein the heating includes thermal conduction or radiation and is applied uniformly over the entire surface of at least one of the substrates to be bonded.

15. The method of claim 1, wherein the first and second substrates are made of semiconductor materials.

* * * * *

UNITED STATES PATENT AND TRADEMARK OFFICE
CERTIFICATE OF CORRECTION

PATENT NO. : 8,349,703 B2
APPLICATION NO. : 12/525493
DATED : January 8, 2013
INVENTOR(S) : Kerdiles et al.

It is certified that error appears in the above-identified patent and that said Letters Patent is hereby corrected as shown below:

Column 12:
Line 59 (claim 1, line 19), indent the subparagraph beginning with "heating at least one" to be in alignment with the subparagraph beginning with "cleaning the surface".

Line 62 (claim 1, line 22), indent the subparagraph beginning with "propagating a bonding wave" to be in alignment with the subparagraph beginning with "cleaning the surface".

Line 66 (claim 1, line 26), indent the subparagraph beginning with "transferring part of the" to be in alignment with the subparagraph beginning with "cleaning the surface".

Column 12, Line 41, Claim 1 will correctly appear as follows:

1. A method for reducing edge voids and blisters when forming a structure comprising a thin layer of semiconductor material transferred from a donor substrate onto a second substrate, which method comprises:
    co-implanting two different atomic species into the donor substrate so as to create a weakened zone delimiting the thin layer to be transferred, each of the species having a maximum concentration at a so-called "peak" depth, with the two different atomic species implanted so that their peaks are aligned at substantially identical depths; and
    molecularly bonding the donor and second substrates together by:
        cleaning the surface of one or both of the substrates by means including a chemical bath under conditions selected so that the surface is etched by less than 10 Å to avoid blister formation during subsequent bonding wave propagation;
        heating at least one or both of the substrates to a temperature in the range of 45 °C to 70 °C then contacting the substrates;
        propagating a bonding wave between the substrates while retaining the substrate temperature in the range of 45 °C to 70 °C to reduce or eliminate edge voids Signed and Sealed this
Fifth Day of March, 2013

Teresa Stanek Rea
*Acting Director of the United States Patent and Trademark Office* during bonding wave propagation; and transferring part of the donor substrate to the second substrate so as to form the thin layer on the second substrate.